United States Patent
Suzuki et al.

(10) Patent No.: US 7,355,642 B2
(45) Date of Patent: Apr. 8, 2008

(54) PHOTO-DETECTION DEVICE

(75) Inventors: Yasuhiro Suzuki, Hamamatsu (JP); Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 487 days.

(21) Appl. No.: 10/535,206

(22) PCT Filed: Nov. 18, 2003

(86) PCT No.: PCT/JP03/14674

§ 371 (c)(1),
(2), (4) Date: May 17, 2005

(87) PCT Pub. No.: WO2004/047180

PCT Pub. Date: Jun. 3, 2004

(65) Prior Publication Data

US 2006/0050160 A1    Mar. 9, 2006

(30) Foreign Application Priority Data

Nov. 18, 2002 (JP) .............................. 2002-334072

(51) Int. Cl.
*H04N 5/335* (2006.01)

(52) U.S. Cl. .................................................. 348/294

(58) Field of Classification Search ................ 348/294, 348/308, 302, 311, 373, 374, 375; 250/208.1, 250/226; 257/290, 291, 292, 231, 233, 222, 257/215

See application file for complete search history.

(56) References Cited

U.S. PATENT DOCUMENTS 6,809,769 B1 * 10/2004 Yang .......................... 348/308
2003/0218120 A1    11/2003 Shibayama .............. 250/214.1

FOREIGN PATENT DOCUMENTS

| EP | 1 207 559 A2 | 5/2002 |
|---|---|---|
| JP | 05-315578 | 11/1993 |
| JP | 2001-242253 | 9/2001 |
| JP | 2001242253 A * | 9/2001 |
| JP | 2001-291877 | 10/2001 |
| JP | 2001291877 A * | 10/2001 |
| JP | 2002-311146 | 10/2002 |
| JP | 2003-264280 | 9/2003 |
| WO | WO 02/12845 A1 | 2/2002 |

* cited by examiner

*Primary Examiner*—Lin Ye
*Assistant Examiner*—Amy Hsu
(74) *Attorney, Agent, or Firm*—Drinker Biddle & Reath LLP

(57) ABSTRACT

The present invention relates to a photo-detecting device having a structure which enables an increase of the number of pixels and advanced high density and further enables precise photo-detection. The photo-detecting device includes N photodiodes, N switches a common wire, an integrating circuit, a first substrate provided with the N photodiodes, and a second substrate provided with the N switches, common wire, and integrating circuit. The N photodiodes and N switches to be electrically connected to each other are electrically connected by bump-connecting the first substrate and the second substrate. In such a construction, a connection wire two-dimensionally laid out that electrically connects the N photodiodes and N switches is unnecessary, thereby shortening the wire path length (reduction of noise). In addition, when the first substrate provided with the N photodiodes are bump-connected to the second substrate provided with the remaining electronic devices, which enables integration of the photodiodes without any consideration for wire layout on the first substrate (high density of pixels).

7 Claims, 9 Drawing Sheets

PHOTO-DETECTION DEVICE

TECHNICAL FIELD

The present invention relates to a photo-detecting device including a plurality of photodiodes that are one-dimensionally or two-dimensionally arranged on the light-receiving surface.

BACKGROUND ART

A photo-detecting device is a device such that includes a plurality of photodiodes that are one-dimensionally or two-dimensionally arranged on the light-receiving surface, and an integrating circuit having an amplifier and a capacitor; there are some cases that include further a signal processing circuit at the later stage of the integrating circuit. In this photo-detecting device, electric charge corresponding to the intensity of incident light is outputted from the photodiode, and that charge is stored in the capacitor. Then, a voltage corresponding to a quantity of the stored electric charge is outputted from the integrating circuit. Thus, when the voltage is measured corresponding to the electric charge generated at each of the plurality of photodiodes, light to be incident upon the light-receiving surface arranged by the plurality of photodiodes can be detected.

For example, a photo-detecting device described in JP-A2001-24253 (Document 1) is known as the aforementioned one. In the photo-detecting device disclosed in Document 1, one integrating circuit is provided for a plurality of photodiodes, and a switch is provided between each photodiode and the input terminal of the integrating circuit. In addition, in this photo-detecting device, the plurality of photodiodes are formed on a first substrate, the integrating circuit is formed on a second substrate, and the rim portions of the first and second substrates are connected to each other by a bonding wire. Then, when each of the plural switches is closed sequentially, an electric charge generated in each of the plurality of photodiodes on the first substrate is inputted sequentially in the integrating circuit on the second substrate, and a voltage corresponding to the electric charge is outputted sequentially from the output terminal of the integrating circuit. This photo-detecting device enables an increase of the number of pixels and advanced high density.

DISCLOSURE OF THE INVENTION

After studying the foregoing prior art, the inventors and others find out the following problems. Namely, in the conventional photo-detecting device, a wire path for movement of electric charge reaching from each photodiode to the input terminal of the integrating circuit includes a wire path reaching from each photodiode to the rim portion on the first substrate, a bonding wire reaching from the rim portion of the first substrate to that of the second substrate, and a wire path reaching from the rim portion on the second substrate to the input terminal of the integrating circuit. When the total wire length is thus long, a stray capacitance in this wire increases. For this reason, in the conventional photo-detecting device, noises contained in the voltage outputted from the integrating circuit are enlarged, which prevents a precise photo-detection.

The present invention is made to solve the aforementioned problems, and it is an object to provide a photo-detecting device having a structure which enables an increase of the number of pixels and advanced high density, and further enables a precise photo-detection.

The photo-detecting device according to the present invention comprises N photodiodes (N: two or more integer), a first substrate in which the N photodiodes are provided, a second substrate bump-connected to the first substrate, N switches each having electrically connectable first and second terminals, arranged in the second substrate while corresponding to the N photodiodes respectively, a common wire provided in the second substrate, and an integrating circuit provided in the second substrate.

Each of the N photodiodes generates electric charge in response to the intensity of incident light. In the first substrate, N first bonding pads corresponding to the N photodiodes respectively are arranged on one surface thereof. The second substrate is disposed with N second bonding pads that correspond to the N first bonding pads on a first surface facing the first substrate, and that each are electrically connected to the associated first bonding pad among the N first bonding pads through a bump. In addition, the second substrate includes a device formation layer between the first surface and a second surface opposing the first surface.

Further, the N switches are provided within the device formation layer of the second substrate while corresponding to the N photodiodes, respectively. In addition, each of first terminals of the N switches is electrically connected to the associated photodiode among the N photodiodes through the associated first bonding pad, bump, and second bonding pad. Both of the common wire and integrating circuit are provided in the device formation layer of the second substrate. Additionally, the above common wire is commonly connected to the respective second terminals of the N switches. Furthermore, said integrating circuit is the one that stores an electric charge inputted through the common wire, having the input terminal electrically connected to the common wire and the output terminal for outputting a voltage corresponding to the stored electric charge.

In the photo-detecting device according to the present invention, when the N switches are closed sequentially, electric charge corresponding to the intensity of incident lights are outputted sequentially from each of the N photodiodes. The electric charge outputted from each of the N photodiodes moves from the first substrate arranged with the photodiodes to the second substrate through the bump, and arrives at the input terminal of the integrating circuit through the switches on the second substrate and the common wire. Then, a voltage corresponding to the electric charge generated by the photodiode is outputted from the output terminal of the integrating circuit. In such a way, the photo-detecting device can detect the light that is incident on the first substrate arrayed with the N photodiodes.

Further, in the photo-detecting device according to the present invention, the first substrate provided with the photodiodes and the second substrate provided with the common wire, integrating circuit, and so on are bump-connected to each other. Further, in the second substrate, the common wire and integrating circuit are provided in the device formation layer that is positioned below the layer provided with the second bonding pads for bump connection. In such a construction, in the photo-detecting device, the electric charge movement path reached from each photodiode to the input terminal of the integrating circuit is shortened, thereby reducing a stray capacitance in the wire on the path. As a result, noises contained in the voltage outputted from the integrating circuit are reduced, which enables to carry out a precise photo-detection. In addition, no circuits for signal processing such as the integrating circuit exist on the first substrate, which enables an increase of the number of pixels and/or high density.

In the photo-detecting device according to the present invention, the N switches, common wire and integrating circuit are preferably arranged in a region positioned within the device formation layer of the second substrate and corresponding to a region on which the N second bonding pads are arranged among the first surface of the second substrate. In addition, in the photo-detecting device according to the present invention, the input terminal of the integrating circuit is preferably connected to the common wire at a position where a maximum distance of electric charge movement paths reaching from the N photodiodes to the input terminal of the integrating circuit becomes minimum. In either case, this is because further shortening of the electric charge movement path, further reduction of the stray capacitance, and further reduction of the noise contained in the output voltage from the integrating circuit can be achieved.

In the photo-detecting device according to the present invention, a layout pitch of the bumps disposed between the first substrate and second substrate is preferably shorter than that of the N photodiodes in the first substrate. Also in this case, further shortening of the electric charge movement path, further reduction of the stray capacitance, and further reduction of the noise contained in the output voltage from the integrating circuit can be achieved. Additionally, it facilitates to make the first substrate smaller than the second one; thus, when the plurality of photo-detecting devices are arranged, the first substrates arranged with the photodiodes can be arranged extremely closely or in touch with each other. Incidentally, a resin is preferably filled between the first and second substrates.

The photo-detecting device according to the present invention may include M photo-detecting units (M: two or more integer) each defining the N switches, common wire and integrating circuit as one unit. Additionally, the M photo-detecting units each have a structure similar to the aforementioned photo-detecting device (photo-detecting device according to the present invention). Further, the photodiodes contained in the M photo-detecting units are provided in the first common substrate, while the switch, common wire and integrating circuit are provided in the device formation layer of the second common substrate. In this case, M×N photodiodes are arrayed on the first common substrate, which enables a further increase of the number of pixels.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BEST MODES FOR CARRYING OUT THE INVENTION

In the following, embodiments of a photo-detecting device according to the present invention will be explained in detail with reference to FIGS. 1-7, 8A, 8B and 9. In the explanation of the drawings, the same elements will be denoted by the same reference symbols and these redundant descriptions will be omitted.

An example of a circuit composition of the photo-detecting device according to the present invention will be first explained with reference to FIGS. 1-3.

Figure 1:
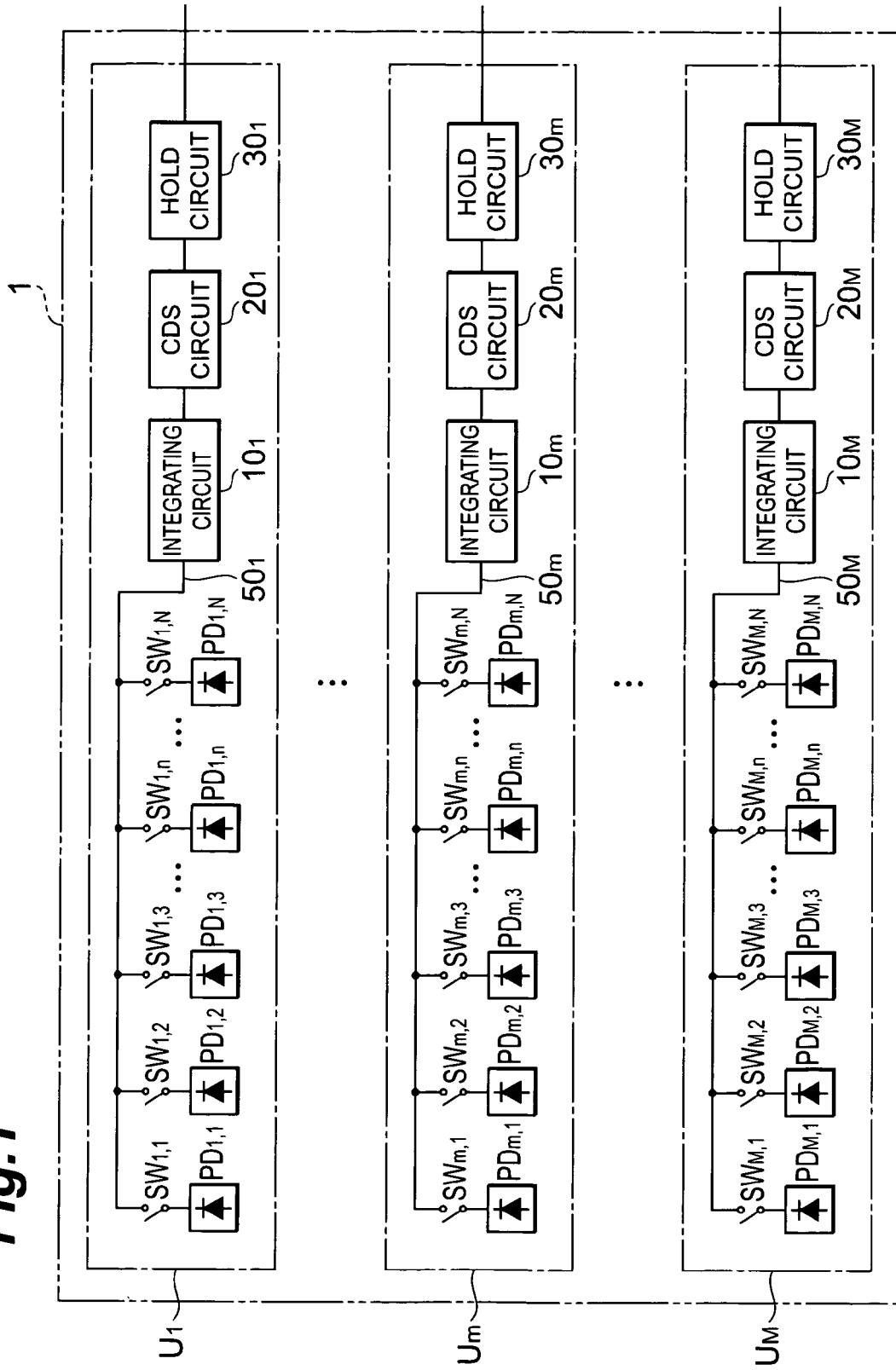
FIG. 1 is a block diagram showing a configuration of one embodiment of the photo-detecting device according to the present invention.

FIG. 1 is a block diagram showing a configuration of one embodiment of the photo-detecting device according to the present invention. In FIG. 1, the photo-detecting device 1 comprises M photo-detecting units $U_1$-$U_M$. Each photo-detecting unit $U_m$ has a mutually similar composition, or includes N photodiodes $PD_{m,1}$-$PD_{m,N}$, N switches $SW_{m,1}$-$SW_{m,N}$, one integrating circuit $10_m$, one CDS (Correlated Double Sampling) circuit $20_m$, and one sample-and-hold circuit (hereinafter, referred to as hold circuit) $30_m$. Here, M is an integer not less than 1, N is an integer not less than 2, m is an integer of 1 to M, and n (emerged later) is an integer of 1 to N.

Each photodiode $PD_{m,n}$ is an optical device that generates an electric charge corresponding to an intensity of an incident light. A switch $SW_{m,n}$ is provided corresponding to the photodiode $PD_{m,n}$; the first terminal thereof is connected to the photodiode $PD_{m,n}$, while the second terminal thereof is connected a common wiring $50_m$. The switch $SW_{m,n}$ enables to carry out electrical opening and closing between the first and second terminals. The common wiring $50_m$ is commonly connected to the respective second terminals of N switches $SW_{m,1}$ to $SW_{m,N}$ contained in a photo-detecting unit $U_m$.

In the integrating circuit $10_m$, the input terminal thereof is connected to the common wiring $50_m$, and an electric charge inputted through the input terminal is stored in the capacitor. Subsequently, the integrating circuit $10_m$ outputs from the output terminal a voltage corresponding to an electric charge stored in the capacitor. The CDS circuit $20_m$ inputs the voltage outputted from the integrating circuit $10_m$ and then outputs a voltage representing a variation in a given period on the inputted voltage. The hold circuit $30_m$ inputs the voltage outputted from the CDS circuit $20_m$, and holds this voltage during a given period.

Figure 2:
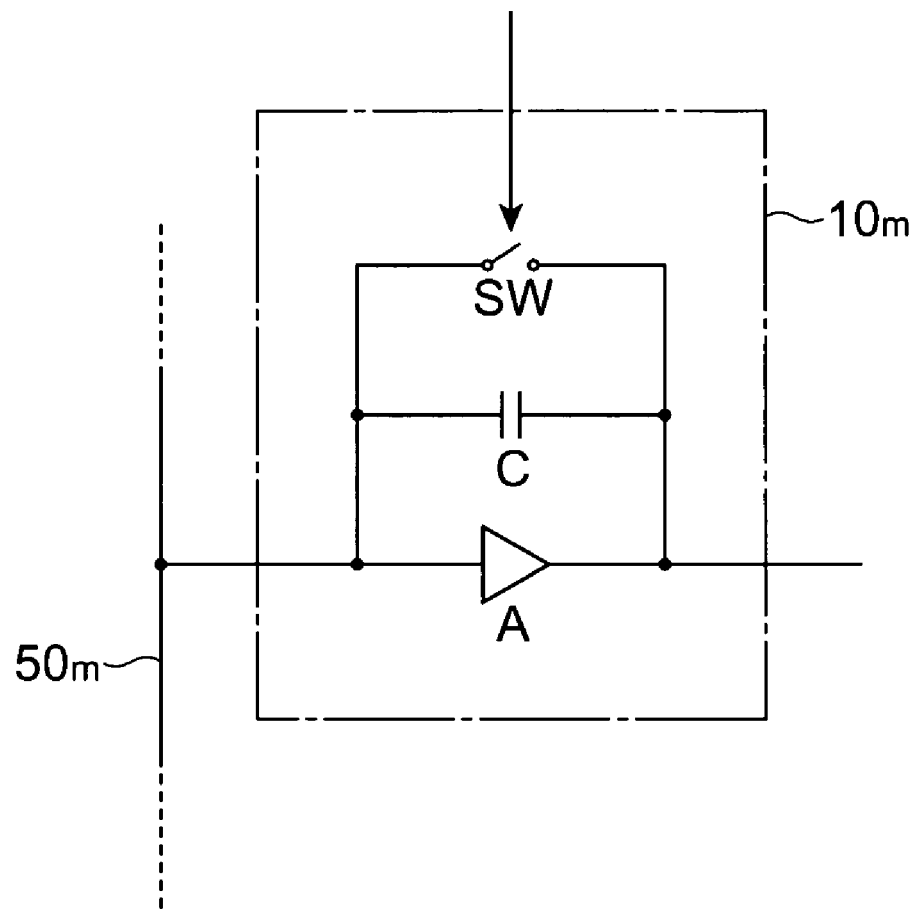
FIG. 2 is a circuit diagram of an integrating circuit included in one embodiment of the photo-detecting device according to the present invention.

FIG. 2 is a circuit diagram of an integrating circuit $10_m$ included in one embodiment of the photo-detecting device according to the present invention. The integrating circuit $10_m$ shown in FIG. 2 has an amplifier, a capacitor C, and a switch SW arranged in parallel between the input and output terminals that are connected to the common wiring $50_m$. When the switch SW is closed, the capacitor C is discharged, and then a voltage outputted from the output terminal of the integrating circuit $10_m$ is initialized. On the other hand, when the switch SW is opened, an electric charge inputted to the input terminal through the common wiring $50_m$ is stored in the capacitor C, and then a voltage corresponding to the electric charge stored in the capacitor C is outputted from the output terminal thereof.

Figure 3:
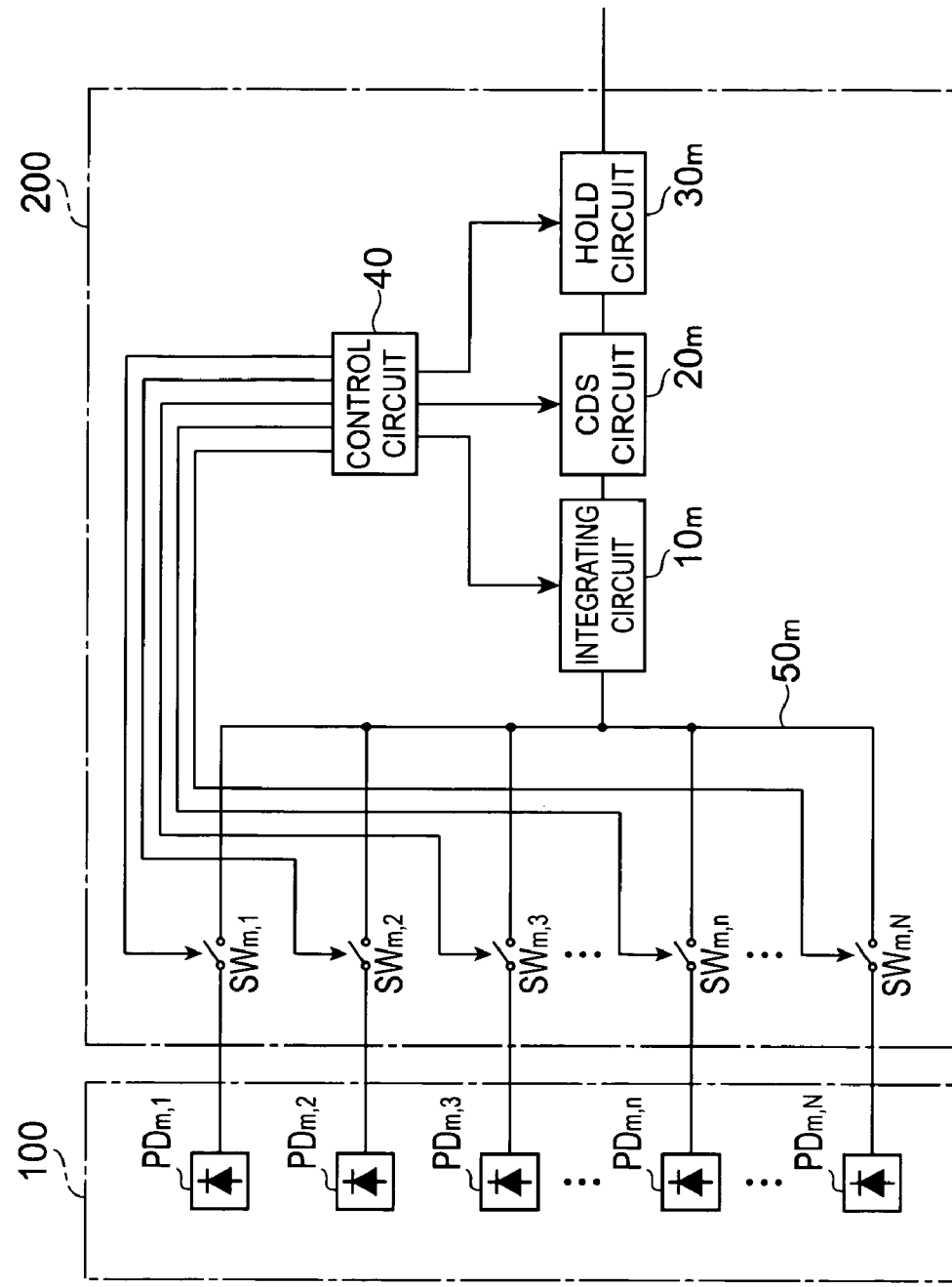
FIG. 3 is a block diagram showing a configuration of the photo-detecting unit and a control circuit included in one embodiment of the photo-detecting device according to the present invention.

FIG. 3 is a block diagram showing a construction of the photo-detecting unit $U_m$ and a control circuit 40 included in one embodiment of the photo-detecting device according to the present invention. The one and only control circuit 40 may be arranged in the photo-detecting device 1 so as to control the operation of the entire photo-detecting device 1. Specifically, the control circuit 40 closes sequentially the N switches $SW_{m,1}$-$SW_{m,N}$ contained in each photo-detecting unit $U_m$, and electrically connects the N photodiodes $PD_{m,1}$-$PD_{m,N}$ to the input terminals of the integrating circuit $10_m$, respectively. The control circuit 40 controls timings of initializations and integral operations at the integrating circuit $10_m$ by controlling opening/closing of the switch SW contained in the integrating circuit $10_m$. In addition, the control circuit 40 controls the operation timing of each of the CDS circuit $20_m$ and hold circuit $30_m$.

In addition, as shown in FIG. 3, each component of the photo-detecting device 1 is divided and arranged into two substrates of a first substrate 100 and a second substrate 200. Namely, M×N photodiodes $PD_{1,1}$-$PD_{M,N}$ are two-dimensionally arranged M rows/N columns on the first substrate 100. Further, M×N switches $SW_{m,1}$-$SW_{m,N}$, M integrating circuits $10_1$-$10_M$, M CDS circuits $20_1$-$20_M$, M hold circuits $30_1$-$30_M$, and sole control circuit 40 are arranged on the second substrate 200. Then, the first substrate 100 and the second substrate 200 are bump-connected to each other.

When light is incident on the first substrate 100, in each photo-detecting unit Um, an electric charge corresponding to an intensity of an incident light is outputted from the photodiode $PD_{m,n}$ corresponding to closed switch $SW_{m,n}$. The electric charge outputted from the photodiode $PD_{m,n}$ is traveled from the first substrate 100 to the second substrate 200 through the bump, and arrived at the input terminal of the integrating circuit $10_m$ through the switch $SW_{m,n}$ and common wire $50_m$ on the second substrate. Then, a voltage corresponding to an electric charge generated in the photodiode $PD_{m,n}$ is outputted from the output terminal of the integrating circuit $10_m$ on the second substrate 200. Further, a voltage representing a variation in a given time is outputted from the CDS circuit $20_m$ on the second substrate 200, and the voltage outputted from the CDS circuit $20_m$ is held during a given period by the hold circuit $30_m$ on the second substrate 200. In each photo-detecting unit $U_m$, N switches $SW_{m,1}$-$SW_{m,N}$ are closed sequentially; thus, a similar procedure will be carried out with respect to an electric charge outputted from each of the N photodiodes $PD_{m,1}$-$PD_{m,N}$.

Next, the arrangement relationship and electrical connection between the first substrate 100 and the second substrate 200 in one embodiment of the photo-detecting device according to the present invention will be explained in detail with reference to FIGS. 4-7.

Figure 4:
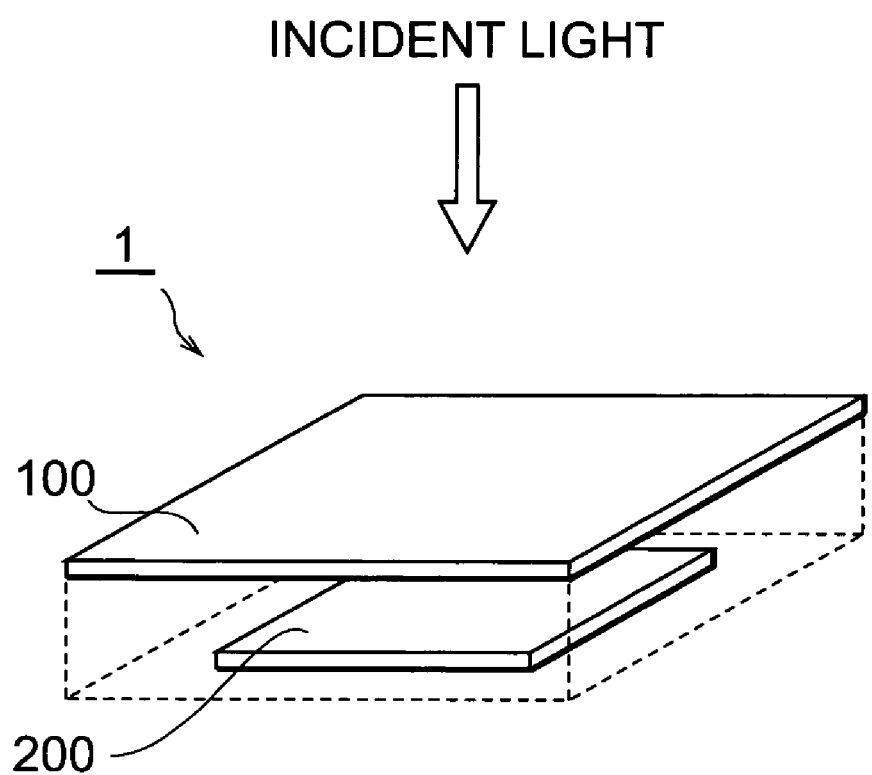
FIG. 4 is a perspective view showing the arrangement relationship between a first substrate and a second substrate in one embodiment of the photo-detecting device according to the present invention.

FIG. 4 is a perspective view showing the arrangement relationship between the first substrate 100 and the second substrate 200 in one embodiment of the photo-detecting device according to the present invention. In the photo-detecting device, the first substrate 100 and the second substrate 200 are bump-connected to each other, and the photodiode $PD_{m,n}$ arranged on the first substrate 100 and the first terminal of the switch $SW_{m,n}$ on the second substrate 200 are electrically connected to each other. Then, as shown in FIG. 4, the substrates 100, 200 are mounted in a stacked state to be overlapped as is seen from a light incident direction. Additionally, it is preferable that the outer frame of the second substrate 200 as is seen from the stacked direction (the direction perpendicular to the main surface of each substrate) is fit to the outer frame of the first substrate 100, or located inside the outer frame of the first substrate 100 (the size of the main surface of the second substrate 200 is smaller than the size of the main surface of the first substrate 100). Such a relationship in size between the first substrate 100 and the second substrate 200 can be achieved by bump-connecting between the first substrate 100 and second substrate 200. In this case, when the plurality of photo-detecting devices 1 are arranged, the first substrates 100 arranged with the photodiodes can be arranged extremely closely or in touch with each other.

Figure 5:
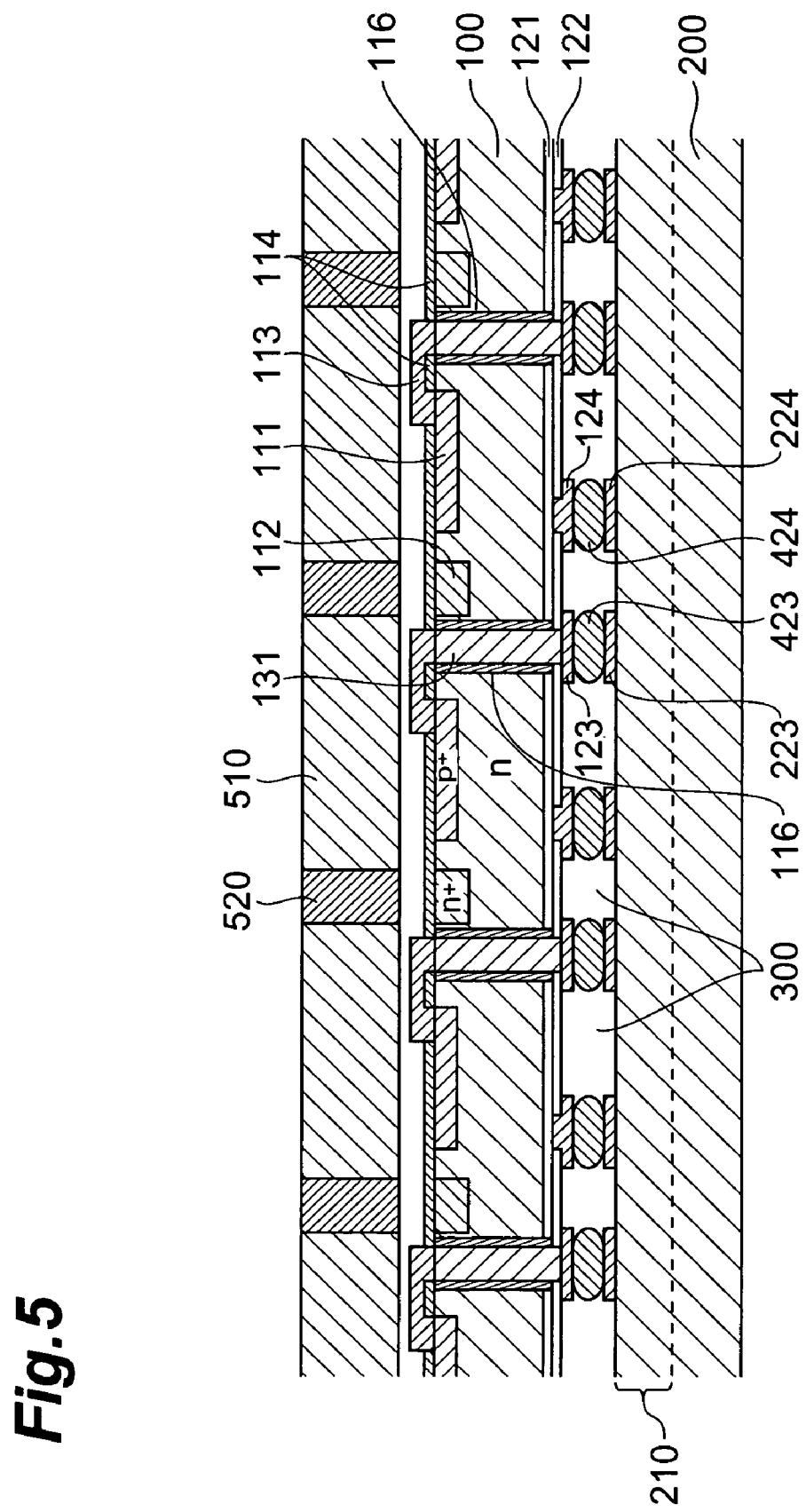
FIG. 5 is a view illustrating a first sectional structure of the first substrate and second substrate in one embodiment of the photo-detecting device according to the present invention.

FIG. 5 is a view illustrating a first sectional structure of the first substrate 100 and second substrate 200 in one embodiment of the photo-detecting device according to the present invention. However, since a basic pattern is repeatedly shown in the horizontal direction in FIG. 5, only the one basic pattern will be explained in the following.

The first substrate 100, which is an n-type semiconductor substrate, is formed of a $p^+$ region 111 constituting a photodiode PD by forming a pn junction with the n-type semiconductor substrate, and of a $n^+$ region 112 as an isolation region on a first surface of the n-type semiconductor substrate. In addition, on a second surface of the n-type semiconductor substrate that is the first substrate 100 (the surface opposite to the first surface and facing the second substrate 200), an $n^+$ layer 121 forming an ohmic contact with a bonding pad 124, an insulating passivation layer 122 for passivating the surface, and a bonding pad 124 electrically connected to the $n^+$ layer 121 penetrating the passivation layer 122 are formed. Further, in the first substrate 100, a through hole penetrating between the first and second surfaces is prepared, and a through electrode 131 is embedded in the through hole. Then, in the first surface side of the first substrate 100, a metal wire 113 electrically connecting the $p^+$ region 111 with the through electrode 131 is formed on an insulating film 114, while on the second surface thereof, a bonding pad 123 is formed, which is electrically connected to the through electrode 131. An insulating layer 116 is formed around the through electrode for electrical insulations from then-type region, $n^+$ layer 121 or the like in the first substrate 100.

The second substrate 200 is a semiconductor substrate including a device formation layer 210; a bonding pad 223 electrically connected to the first terminal of the switch SW, and a bonding pad 224 electrically connected to ground potential are formed on the first surface (the surface facing the first substrate 100) of the semiconductor substrate. Then, the bonding pad 123 of the first substrate 100 and the bonding pad 223 of the second substrate 200 are connected to each other through a bump 423, while a bonding pad 124 of the first substrate 100 and a bonding pad 224 of the second substrate 200 are connected to each other through a bump 424. A gap between the first substrate 100 and second substrate 200 is filled with a resin 300.

Further, a scintillator 510 and a shield material 520 are arranged on the side of the first surface of the first substrate 100. The scintillator 510 is arranged above the p+ region of the first substrate 100, and generates a scintillation light when a radiation such as X-rays is incident thereon. The shield material 520 is arranged above the n+ region 112 of the first substrate 100, and is a member for preventing the transmission of the radiation such as X-rays and securing the scintillator 510.

In the construction shown in FIG. 5, when the radiation such as X-rays is incident on the scintillator 510, a scintillation light can be generated from the scintillator 510. When the scintillation light is incident on the p+ region of the first substrate 100, an electric charge is generated at the pn junction portion. The generated electric charge passes through the metal wire 113, through electrode 131, bonding pad 123, bump 423, and the bonding pad 223 of the second substrate 200, further passes through the switch SW formed within the device formation region 210 of the second substrate 200, and then arrives at the input terminal of the integrating circuit $10_m$. When the switch $SW_{m,n}$ of the integrating circuit $10_m$ is opened, an electric charge inputted from the input terminal thereof is stored in the capacitive element C. Then, a voltage corresponding to an electric charge stored in the capacitive element C is outputted from the output terminal of the integrating circuit $10_m$.

Figure 6:
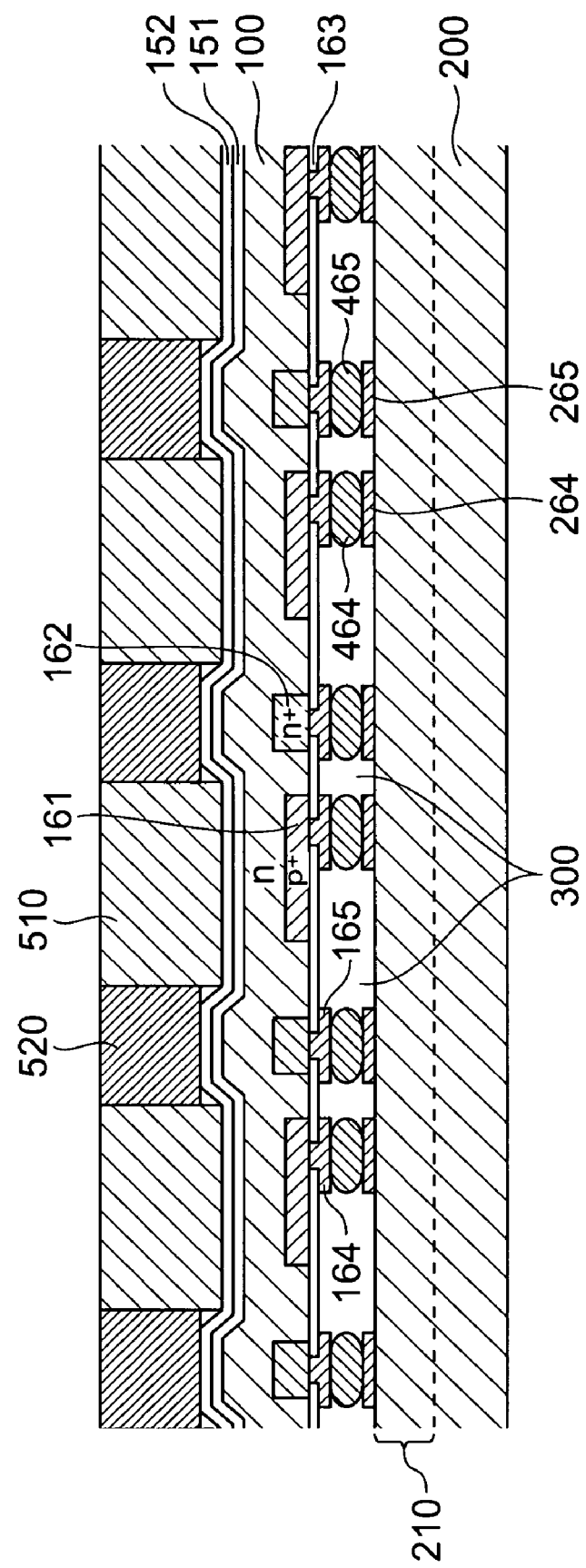
FIG. 6 is a view illustrating a second sectional structure of the first substrate and second substrate in one embodiment of the photo-detecting device according to the present invention.

FIG. 6 is a view illustrating a second sectional structure of a first substrate 100 and a second substrate 200 in one embodiment of the photo-detecting device according to the present invention. However, also in FIG. 6, since a basic pattern is repeatedly shown in the horizontal direction, only the basic pattern is explained in the following.

The first substrate 100 is a n-type semiconductor substrate, and an n+-type accumulation layer 151 for preventing electric charge recombination and a passivation layer 152 for passivating the surface are formed on a first face (face facing the scintillator 510) of the n-type semiconductor substrate. On a second face (face facing the second substrate 200) of the n-type semiconductor substrate that is the first substrate 100, the p+ region 161 constituting a photodiode PD by forming a pn junction with the n-type semiconductor substrate is formed, an n+region 162 as an isolation region is formed, and a passivation layer 152 is formed on top thereof. In addition, on the second face of the first substrate 100, a bonding pad 164 electrically connected to the p+ region 161 and a boding pad 165 electrically connected to the n+ region 162 are formed.

The second substrate 200 is a semiconductor substrate, and on a first face (face facing the first substrate 100) of the semiconductor substrate, a bonding pad 264 and a bonding pad 265 connected to the first terminal of a switch $SW_{m,n}$ are formed. Then, the bonding pad 164 of the first substrate 100 and the bonding pad 264 of the second substrate 200 are connected to each other through a bump 464. The bonding pad 165 of the first substrate 100 and the bonding pad 265 are connected to each other through a bump 465. A gap between the first substrate 100 and second substrate 200 is filled with a resin 300.

In addition, a scintillator 510 and a shield material 520 are arranged on the side of the first face of the first substrate 100. The scintillator 510 is arranged above the p+ region 161 of the first substrate 100, and generates a scintillation light when a radiation such as X-rays is incident thereon. The shield material 520 is arranged above the n+ region 162 of the first substrate 100, and is a member for preventing the transmission of the radiation such as X-rays and securing the scintillator 510. Further, in the first substrate 100, the first face side is etched at the portion in which the p+ region 161 is formed to thin the thickness of the substrate.

In the construction shown in FIG. 6, when the radiation such as X-rays is incident on the scintillator 510, a scintillation light from the scintillator 510 is generated. When the scintillation light penetrates the first substrate 100 and subsequently is incident on the p+ region 161, an electric charge is generates at the pn junction portion. The generated electric charge passes through the bonding pad 164, bump 464, and the bonding pad 264 of the second substrate 200, then through the switch $SW_{m,n}$ formed in the device formation layer 210 of the second substrate 200, and arrives at the input terminal of an integrating circuit 10. When the switch SW is opened, an electric charge inputted from the input terminal is stored in a capacitor C. Thus, a voltage corresponding to an electric charge stored in the capacitor C is outputted from the output terminal of the integrating circuit $10_m$.

Figure 7:
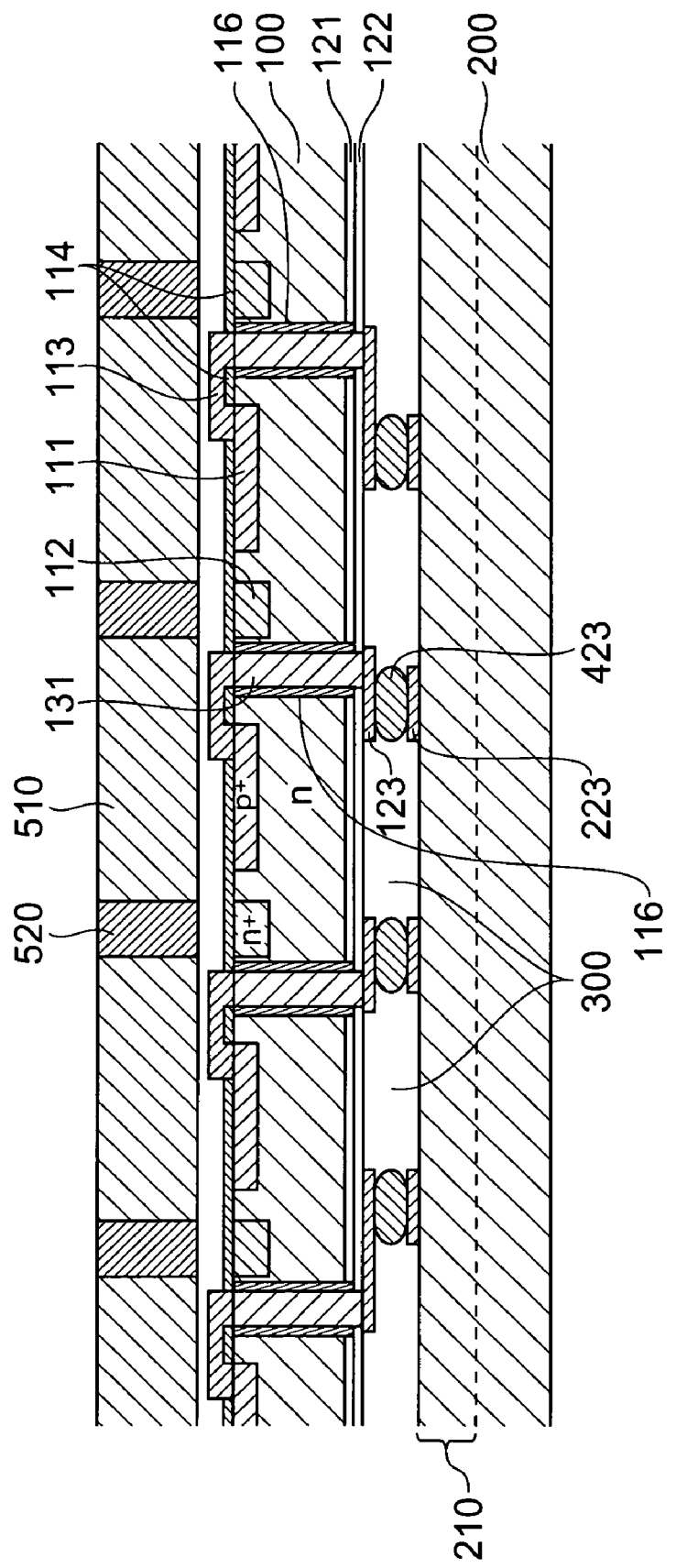
FIG. 7 is a view illustrating a third sectional structure of the first substrate and second substrate in one embodiment of the photo-detecting device according to the present invention.

FIG. 7 is a view illustrating a third sectional structure of a first substrate 100 and a second substrate 200 in one embodiment of the photo-detecting device according to the present invention. Though the sectional structure shown in FIG. 7 is similar to that shown in FIG. 5, there is a difference in that a layout pitch of bumps 423 between the first substrate 100 and second substrate 200 is shorter than that of the photodiodes in the first substrate 100. In order to render such a construction, a layout pitch of bonding pads 223 formed on the second substrate 200 is narrower than that of the photodiodes in the first substrate 100. A bonding pad 123 formed on a second face side of the first substrate 100 is lengthened from a connection position with a through electrode 131 to a connection position with the bump 424 in case of necessity. Incidentally, though a bonding pad 124, a bonding pad 224 and the bump 423 are not represented in FIG. 7, these are also provided in a similar way. Additionally, also in the sectional structure shown in FIG. 6, the layout pitch of the bumps 464, 465 between the first substrate 100 and second substrate 200 may be shorter than that of the photodiodes in the first substrate 100.

A sectional structure of a second substrate 200 in one embodiment of the photo-detecting device according to the present invention will be next explained in detail with reference to FIGS. 8A-8B.

Figure 8A:
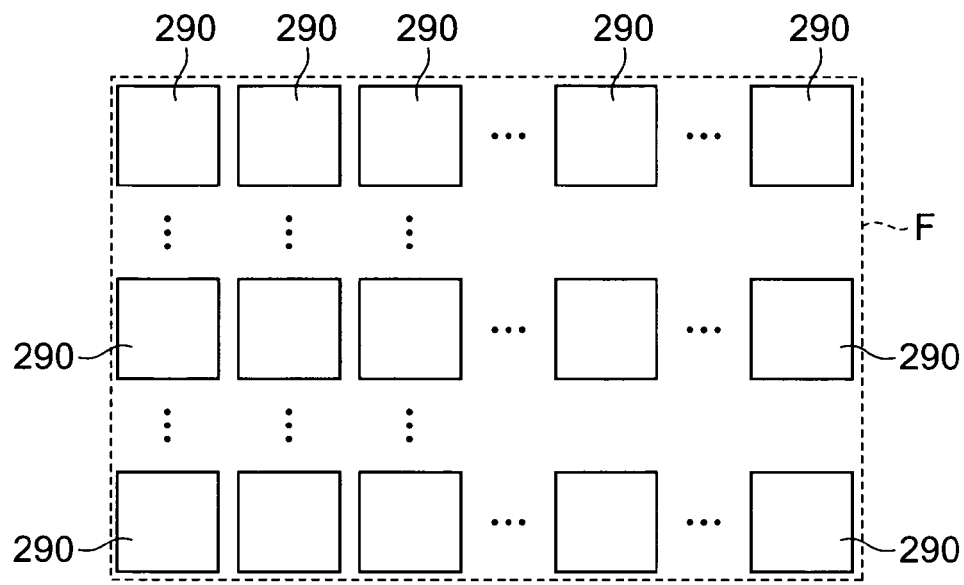
FIG. 8A and FIG. 8B are schematic diagrams for explaining a hierarchical structure of the second substrate in one embodiment of the photo-detecting device according to the present invention.
Figure 8B:
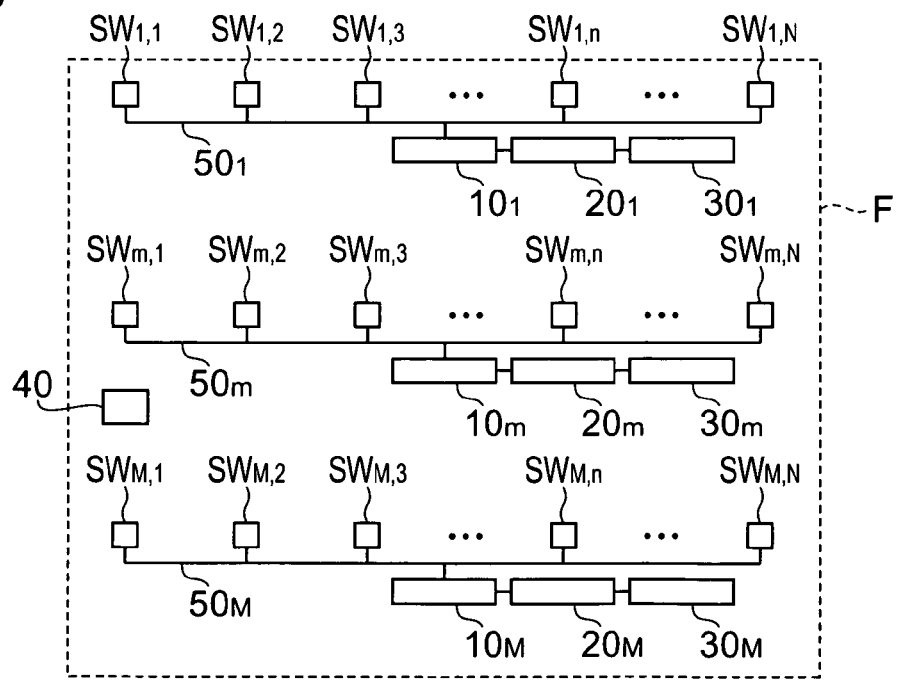

FIGS. 8A-8B are schematic diagrams showing a hierarchical structure of the second substrate 200 in one embodiment of the photo-detecting device according to the present invention; FIG. 8A schematically shows an arrangement of bonding pads 290 (corresponding to the bonding pads 223, 224 in FIGS. 5 and 7, and the boding pads 264, 265 in FIG. 6) in a layer where the bonding pads 290 for bump connection are arranged, while FIG. 8B schematically shows an arrangement of a formation region of a semiconductor layer and a gate layer in N switches $SW_{m,1}$-$SW_{m,N}$, an integrating circuit $10_m$, a CDS circuit $20_m$, a hold circuit $30_m$, and a control circuit 40 included in each photo-detecting unit $U_m$.

In addition, in FIGS. 8A-8B, a region F represents a minimum rectangular region including all the bonding pads 290 when the second substrate 200 is seen perpendicularly to the face of the second substrate 200.

As shown in FIGS. 8A-8B, in the second substrate 200, the N switches $SW_{m,1}$-$SW_{m,N}$, integrating circuit $10_m$, CDS circuit $20_m$, hold circuit $30_m$, and control circuit 40 included in each photo-detecting unit $U_m$ are formed in a layer (device formation layer 210) lower than that provided with the bonding pads 290 for bump connection. Note that the control circuit 40 may be further formed in the device formation layer. In addition, these device and circuit is preferably formed within the F region. Further, in each photo-detecting unit $U_m$, when a distance along an electric charge movement path from each of N photodiodes $PD_{m,n}$ to the input terminal of the integrating circuit $10_m$ is defined as $L_{m,n}$, the input terminal of an integrating circuit $10_m$ is preferably connected to a common wire $50_m$ at the position such that a maximum distance among distances $L_{m,1}$-$L_{m,N}$ is rendered to a minimum.

Figure 9:
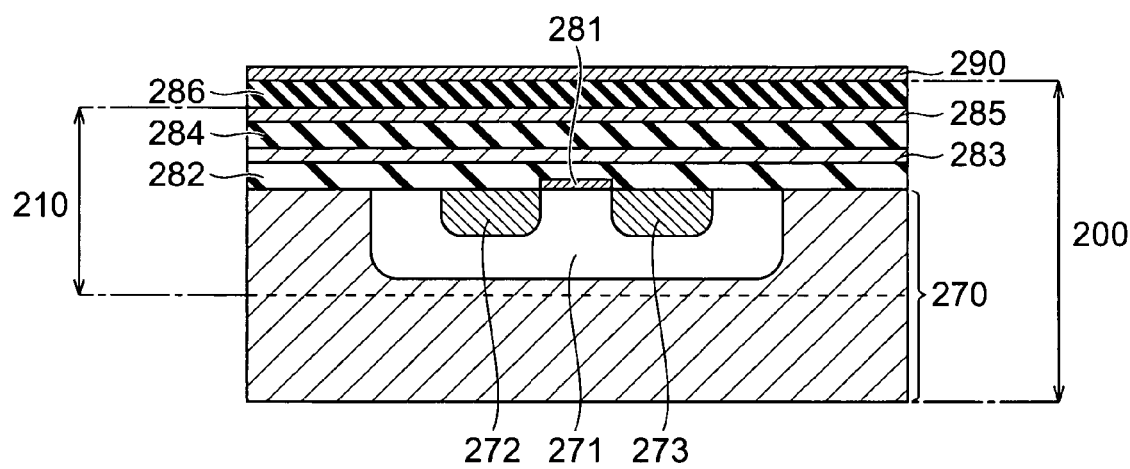
FIG. 9 is a view showing a sectional structure of a device formation layer of the second substrate in one embodiment of the photo-detecting device according to the present invention.

FIG. 9 is a view showing a sectional structure of a device formation layer 210 in a second substrate 200 in one embodiment of the photo-detecting device according to the present invention. As schematically shown in FIG. 9, in the second substrate 200, a semiconductor layer 270, a gate layer 281, an insulating layer 282, a first metal wire layer 283, an insulating layer 284, a second metal wire layer 285, an insulating layer 286, and a bonding pad 290 are provided in turn from the second face to the first face (the face facing the first substrate 100).

The semiconductor layer 270 is an n-type semiconductor substrate; an $n^+$-type region 271 is formed therein, and a $p^+$-type region 272 and a $p^+$-type region 273 are formed within the $n^+$-type region 271. A variety of circuits (integrating circuit $10_m$, CDS circuit $20_m$, hold circuit $30_m$, and control circuit 40) are constructed in the semiconductor layer 270 and gate layer 281. The first metal wire layer 283 is used as a signal wire between or in the circuits. The first metal wire layer 283 and second metal wire layer 285 each are electrically connected to the semiconductor layer 270 or gate layer 281 through a contact hole at a predetermined portion. Also, the bonding pad 290 is electrically connected to the first metal wire layer 283 through a contact hole at a predetermined portion.

As described above, in the photo-detecting device 1, the N switches $SW_{m,1}$-$SW_{m,N}$, common wire $50_m$, integrating circuit $10_m$, CDS circuit $20_m$, hold circuit $30_m$, and control circuit 40 included in each photo-detecting unit $U_m$ also are formed in the device formation layer 210 located lower than that provided with the bonding pads 290 for bump connection.

In such a constructed photo-detecting device 1, downsizing of the second substrate 200 is facilitated, and the electric charge movement path reached from each photodiode $PD_{m,n}$ to the input terminal of the integrating circuit $10_m$ is shortened, thereby reducing a stray capacitance in the wire on the path. As a result, noises contained in the voltage outputted from the integrating circuit $10_m$ is reduced, which enables to carry out a precise photo-detection.

The photo-detecting device 1 having the aforementioned construction (photo-detecting device according to the present invention) can bring the following effects. Namely, the electric charge path from each photodiode $PD_{m,n}$ to the input terminal of the integrating circuit $10_m$ is shortened, thus reducing the stray capacitance in the wire on the path. As a result, noises contained in the voltage are reduced, which enables precise photo-detection. In addition, any circuits for signal processing such as the integrating circuit $10_m$ are not present on the first substrate 100, which enables an increase of the number of pixels and/or high density. It is easier to reduce the size of the main surface of the second substrate 200 as compared with that of the main surface of the first substrate 100, and when a plurality of photo-detecting devices 1 are arranged, it can be arranged while each first substrate 100 provided with the photodiode is arranged extremely closely or in contact therewith. An optimum manufacturing process can be adopted by the first substrate 100 formed of the photodiode array and the second substrate 200 formed of the signal processing circuit such as the integrating circuit $10_m$; this point also is preferable.

Further, as compared with a conventional photo-detecting device (JP-A-2001-242253), the photo-detecting device 1 has the following further advantages. Namely, in the conventional photo-detecting device, the first substrate is connected with the second substrate through a wire bonding; thus, when scintillators are arranged on a first substrate, any scintillators cannot be disposed above pads for wire bonding, or even when the scintillators are disposed thereon, these shape must be rendered to be different from that of another scintillator. From this matter, in the conventional photo-detecting device, when a plurality of photo-detecting elements are arranged in parallel, a plurality of photodiodes on each first substrate cannot be arranged in a uniform pitch, or the plurality of photodiodes on the first substrate cannot be detected in a uniform sensitivity even in one photo-detecting element. In contrast, the aforementioned problem never occurs in the photo-detecting device 1 according to the present invention since the first substrate is bump-connected to the second substrate, thereby making the second substrate smaller than the first one.

In the present invention, a variety of variations are possible, not limited by the aforementioned embodiment. For example, the sectional structures of the first substrate 100 and second substrate 200 are not limited to those illustrated in FIGS. 5-7 and 9, respectively. In addition, still another circuit (for instance, an A/D conversion circuit converting an output voltage from the hold circuit $30_m$ and the like) may be arranged in the device formation layer 210 of the second substrate 200.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

As stated above, in accordance with the present invention, the first substrate provided with the photodiodes and the second substrate provided with the common wire, integrating circuit, and so on are bump-connected to each other. Further, in the second substrate, the common wire and integrating circuit are provided in the device formation layer that is positioned below the layer provided with the second bonding pads for bump connection. In such a construction, in the photo-detecting device, the electric charge movement path reached from each photodiode to the input terminal of the integrating circuit is shortened, thereby reducing a stray capacitance in the wire on the path. As a result, noise contained in the voltage outputted from the integrating circuit is reduced, which enables to carry out a precise photo-detection. In addition, any circuits for signal processing such as the integrating circuit are not present on the first substrate, which enables an increase of the number of pixels and/or high density.

The invention claimed is:

1. A photo-detecting device comprising:

N photodiodes (N: two or more integer) each generating an electric charge in response to an intensity of incident light;

a first substrate in which said N photodiodes are provided, said N first bonding pads corresponding to said N photodiodes respectively are arranged on one surface of said first substrate;

a second substrate bump-connected with said first substrate, said second substrate having a first surface which faces said first substrate and on which N second bonding pads corresponding to said N first bonding pads are provided while each electrically connected to the associated first bonding pad among said N first bonding pads through a bump, said second substrate including a device formation layer between said first surface and a second surface opposing said first surface;

N switches provided in said device formation layer of said second substrate corresponding to said N photodiodes respectively and each having electrically switchable first and second terminals, each of said first terminals being electrically connected to the associated photodiode among said N photodiodes through the associated first bonding pad, bump, and second bonding pad;

a common wire provided in said device formation layer of said second substrate, said common wire being commonly connected to each of said second terminals of said N switches; and an integrating circuit provided in said device formation layer of said second substrate, for storing the inputted electron charge through said common wire, said integrating circuit having an input terminal electrically connected to said common wire and an output terminal for outputting a voltage corresponding to the stored electric charge.

2. A photo-detecting device according to claim 1, wherein said N switches, said common wire, and said integrating circuit are arranged in a region within said device formation layer of said second substrate, said region corresponding to a region, in which said N second bonding pads are arranged, within said first surface of said second substrate.

3. A photo-detecting device according to claim 1, wherein the input terminal of said integrating circuit is connected to said common wire at a position where a maximum distance of electric charge movement paths respectively reaching from said N photodiodes to the input terminal of said integrating circuit becomes minimum.

4. A photo-detecting device according to claim 1, wherein a layout pitch of said bumps disposed between said first substrate and said second substrate is shorter than that of said N photodiodes in said first substrate.

5. A photo-detecting device according to claim 1, wherein a resin is filled between said first and second substrates.

6. A photo-detecting device comprising M photo-detecting units (M: two or more integer) each having the same structure as a photo-detecting device according to claim 1.

7. A photo-detecting device comprising M photo-detecting units (M: two or more integer) each having the same structure as a photo-detecting device according to claim 1;

a first common substrate corresponding to each of said first substrates of said M photo-detecting units; and a second common substrate corresponding to each of said second substrates of said M photo-detecting units.

* * * * *